(12) United States Patent
Safran et al.

(10) Patent No.: US 9,847,290 B1
(45) Date of Patent: Dec. 19, 2017

(54) THROUGH-SILICON VIA WITH IMPROVED SUBSTRATE CONTACT FOR REDUCED THROUGH-SILICON VIA (TSV) CAPACITANCE VARIABILITY

(71) Applicant: GLOBALFOUNDRIES INC., Grand Cayman (KY)

(72) Inventors: John M. Safran, Wappingers Falls, NY (US); Jochonia N. Nxumalo, Wappingers Falls, NY (US); Joyce C. Liu, Carmel, NY (US); Sami Rosenblatt, White Plains, NY (US); Chandrasekharan Kothandaraman, New York, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/375,924

(22) Filed: Dec. 12, 2016

(51) Int. Cl.
*H01L 21/768* (2006.01)
*H01L 29/40* (2006.01)
*H01L 29/45* (2006.01)
*H01L 23/522* (2006.01)
*H01L 23/528* (2006.01)

(52) U.S. Cl.
CPC .... *H01L 23/5226* (2013.01); *H01L 21/76807* (2013.01); *H01L 21/76825* (2013.01); *H01L 21/76831* (2013.01); *H01L 21/76877* (2013.01); *H01L 23/528* (2013.01)

(58) Field of Classification Search
CPC ........... H01L 23/5384; H01L 21/76898; H01L 23/481; H01L 24/27; H01L 23/528; H01L 23/5226; H01L 23/5386; H01L 21/76831; H01L 21/76877; H01L 23/49827; H01L 21/486
See application file for complete search history.

(56) References Cited

U.S. PATENT DOCUMENTS

| 8,441,104 | B1 | 5/2013 | Hu et al. | |
| 2004/0261839 | A1* | 12/2004 | Gee | H01L 21/76898 136/256 |
| 2012/0080802 | A1* | 4/2012 | Cheng | H01L 23/481 257/774 |
| 2014/0054742 | A1 | 2/2014 | Katti | |
| 2014/0322904 | A1* | 10/2014 | Kim | H01L 23/481 438/516 |

OTHER PUBLICATIONS

Bandyopadhyay, et al., "Electrical Modeling of Through Silicon and Package Vias", IEEE, 2009, 8 pages.

* cited by examiner

*Primary Examiner* — Jasmine Clark
(74) *Attorney, Agent, or Firm* — Anthony Canale; Andrew M. Calderon; Roberts Mlotkowski Safran Cole & Calderon, P.C.

(57) ABSTRACT

The present disclosure relates to semiconductor structures and, more particularly, to Through-Silicon Via (TSV) structures with improved substrate contact and methods of manufacture. The structure includes: a substrate of a first species type; a layer of different species type on the substrate; a through substrate via formed through the substrate and comprising an insulator sidewall and conductive fill material; a second species type adjacent the through substrate via; a first contact in electrical contact with the layer of different species type; and a second contact in electrical contact with the conductive fill material of the through substrate via.

13 Claims, 3 Drawing Sheets

THROUGH-SILICON VIA WITH IMPROVED SUBSTRATE CONTACT FOR REDUCED THROUGH-SILICON VIA (TSV) CAPACITANCE VARIABILITY

FIELD OF THE INVENTION

The present disclosure relates to semiconductor structures and, more particularly, to through-silicon via (TSV) structures with improved substrate contact and methods of manufacture.

BACKGROUND

A via is an electrical connection between wiring structures (e.g., wiring layers) in a physical electronic circuit that goes through the plane of one or more adjacent layers. For example, in integrated circuit design, a via is a small opening in an insulating oxide layer that allows a conductive connection between different wiring layers. A via connecting the lowest layer of metal to diffusion or poly is typically called a "contact". A through-silicon via (TSV) is a vertical electrical connection (via) passing completely through a silicon wafer or die TSV plasma processing causes a depletion region of semiconductor (silicon) material adjacent to the TSV. This depletion results in a poor substrate contact and, also, causes a variability in the electrical characteristics of the TSV. This variability affects the ability to carry moderate to high frequency signals. More specifically, TSV processes produce a MOS capacitor in series with the TSV oxide capacitor. The depletion/inversion in the semiconductor (silicon) substrate adds to the impedance of the TSV (which is used for carrying high frequency signals). While the oxide capacitance is fixed by geometry, the series capacitance is a function of doping and processing.

SUMMARY

In an aspect of the disclosure, a structure comprises: a substrate of a first species type; a layer of different species type on the substrate; a through substrate via formed through the substrate and comprising an insulator sidewall and conductive fill material; a second species type adjacent the through substrate via; a first contact in electrical contact with the layer of different species type; and a second contact in electrical contact with the conductive fill material of the through substrate via.

In an aspect of the disclosure, a structure comprises: a p-type substrate; an N+ layer on the substrate; a through substrate via formed through the substrate and comprising an insulator sidewall and conductive fill material and surrounded by n-type species; a first contact in direct electrical contact with the N+ layer and isolated from the conductive fill material by the insulator sidewall; and a second contact in electrical contact with the conductive fill material of the through substrate via.

In an aspect of the disclosure, a method comprises: forming a layer of first species type on the substrate; converting the substrate from a first type of material to a second type of material during formation of a via structure; forming a first contact in direct electrical contact with the layer of first species type; and forming a second contact in electrical contact with conductive fill material of the via structure.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to through-silicon via (TSV) structures with improved substrate contact and methods of manufacture. More specifically, the TSV structures described herein provide improved substrate contact for reduced TSV capacitance variability from die to die and across all frequencies. Accordingly, and advantageously, the TSV structures described herein provide a solution to the variability in the TSV impedance that is caused by conversion of the p-type semiconductor (silicon) substrate to an n-type resulting from TSV plasma etching processes.

The capacitance of the TSV can be variable from wafer to wafer as well as from die to die. For example, when the TSV is manufactured by a BOSCH process, the p-type semiconductor (silicon) substrate was found to be converted to n-type semiconductor (silicon). This was confirmed by Scanning Capacitance Microscopy (SCM), with the hypotheses that the formation of boron complexes (e.g., n-type species) behave like n-type impurities. Moreover, C-V characterization shows the presence of a N-type layer in the semiconductor (silicon). However, by utilizing an N-type implant layer described herein, it is now possible to produce an improved contact to the substrate near the TSV. Specifically, the N-type implant layer produces a uniform TSV capacitance.

The TSV structures with improved substrate contact of the present disclosure can be manufactured in a number of ways using a number of different tools. In general, though, the methodologies and tools are used to form structures with dimensions in the micrometer and nanometer scale. The methodologies, i.e., technologies, employed to manufacture the TSV structures with improved substrate contact of the present disclosure have been adopted from integrated circuit (IC) technology. For example, the structures are built on wafers and are realized in films of material patterned by photolithographic processes on the top of a wafer. In particular, the fabrication of the TSV structures with improved substrate contact uses three basic building blocks: (i) deposition of thin films of material on a substrate, (ii) applying a patterned mask on top of the films by photolithographic imaging, and (iii) etching the films selectively to the mask.

Figure 1:
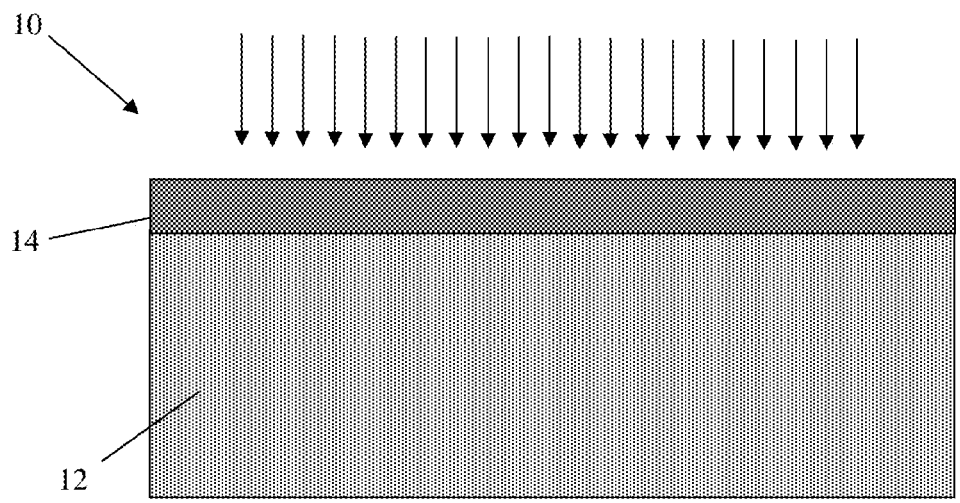
FIG. 1 shows a semiconductor substrate with an N-type implant layer in accordance with aspects of the present disclosure.

FIG. 1 shows a semiconductor substrate with an N-type implant in accordance with aspects of the present disclosure. More specifically, the structure 10 shown in FIG. 1 includes a semiconductor substrate 12. In embodiments, the substrate 12 may be a p-type substrate composed of any suitable Si containing material including, but not limited to, Si, SiGe, SiGeC and SiC, to name a few. The substrate 12 can be a bulk substrate or silicon-on-insulator (SOI) substrate, as examples.

In embodiments, an N+ layer 14 is formed in the substrate 12, preferably in an area of TSV patterning and contact formation. In the SOI example, the N+ layer 14 would be formed below the insulator layer, e.g., buried oxide layer. That is, in an SOI implementation, for example, an N-band implant is created below the buried oxide insulator and abutting the n-layer created by TSV insertion processes.

In more specific embodiments, the N+ layer 14 can be formed by an ion implantation process or diffusion layer processes using n-type implants, e.g., Arsenic and Phosphorus. In embodiments, the ion implantation process will be a deep ion implant resulting in an N+ layer 14 (e.g., N+ band layer 14). As should be understood by those of skill in the art, the energy of the ions, as well as the ion species and the composition of the target (e.g., substrate 12) determine the depth of penetration of the ions in the substrate 12. For example, the typical ion energies for the ion implantation process can be in the range of 1 to 10 keV; although other energies are contemplated herein. The depth of the ion implantation can result in a penetration of a few nanometers to more, e.g., between about 10 nm to about 1 µm.

Figure 2:
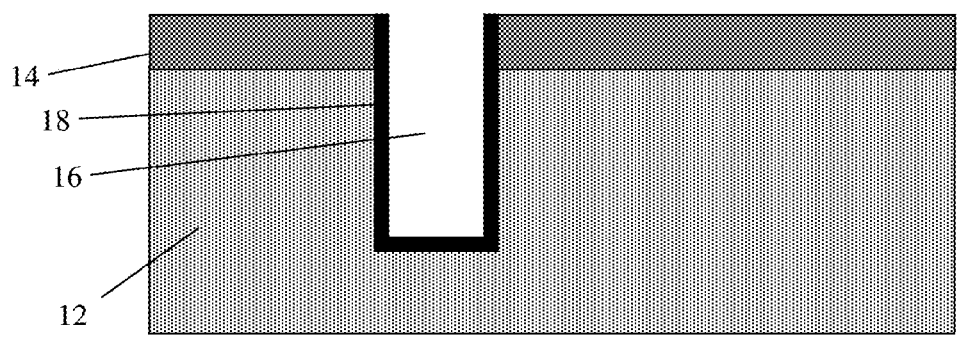
FIG. 2 shows a via structure with an N+ conversion, amongst other features, in accordance with aspects of the present disclosure.

In FIG. 2, a via structure 16 is formed in the substrate 12 using standard etching processes which convert the p-type substrate 12 into an n-type material 18 adjacent to the via structures 16. More specifically, in embodiments, the via structure 16 is formed by a reactive ion etching (RIE) process and, more particularly, a BOSCH process, e.g., pulsed or time-multiplexed etching process, which alternates repeatedly between two modes to achieve a nearly vertical via structure 16.

By way of more specific example, in the first mode, a standard, nearly isotropic plasma etch is performed, e.g., sulfur hexafluoride ($SF_6$), followed by a second mode of depositing a chemically inert passivation layer (using, e.g., $C_4F_8$ (Octafluorocyclobutane) source gas, to yield a substance similar to Teflon). In embodiments, the passivation layer will protect the substrate 12 from chemical attack and prevent further etching of the substrate 12. It is believed that in the first mode the plasma contains ions which attack the substrate 12 from a nearly vertical direction, converting the p-type substrate to n-type semiconductor (silicon) 18 adjacent to the via structure 16, e.g., the bottom and sidewalls of the via structure 16. The n-type semiconductor (silicon) 18 adjacent to the via structure 16 is in electrical and direct contact with the N+ layer 14. The etch/deposit steps are repeated many times resulting in a large number of very small isotropic etch steps taking place only at the bottom of the etched pits.

Figure 3:
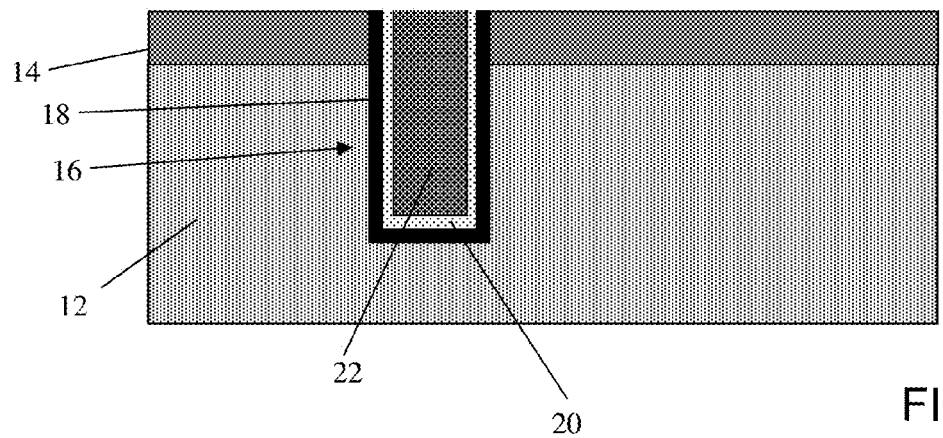
FIG. 3 shows a via structure filled with insulator and conductive material, amongst other features, in accordance with aspects of the present disclosure.

As shown in FIG. 3, the via structure 16 is lined with an insulator material 20 and filled with a conductive material 22. In embodiments, the insulator material 20 is an oxide material, deposited using conventional deposition methods. For example, the insulator material 20 can be deposited on the sidewalls and bottom of the via structure 16 by a chemical vapor deposition (CVD). Following the liner deposition, a conductive material 22, e.g., copper, tungsten, aluminum, etc., can be deposited in the via structure 16. The conductive material 22 can be deposited by a conventional CVD process, followed by a chemical mechanical polishing (CMP) to remove the conductive material 22 and the insulator material 20 from a surface of the substrate 12. In embodiments, the insulator material 20 will provide electrical isolation between the conductive material 22 and the N+ layer 14.

Figure 4:
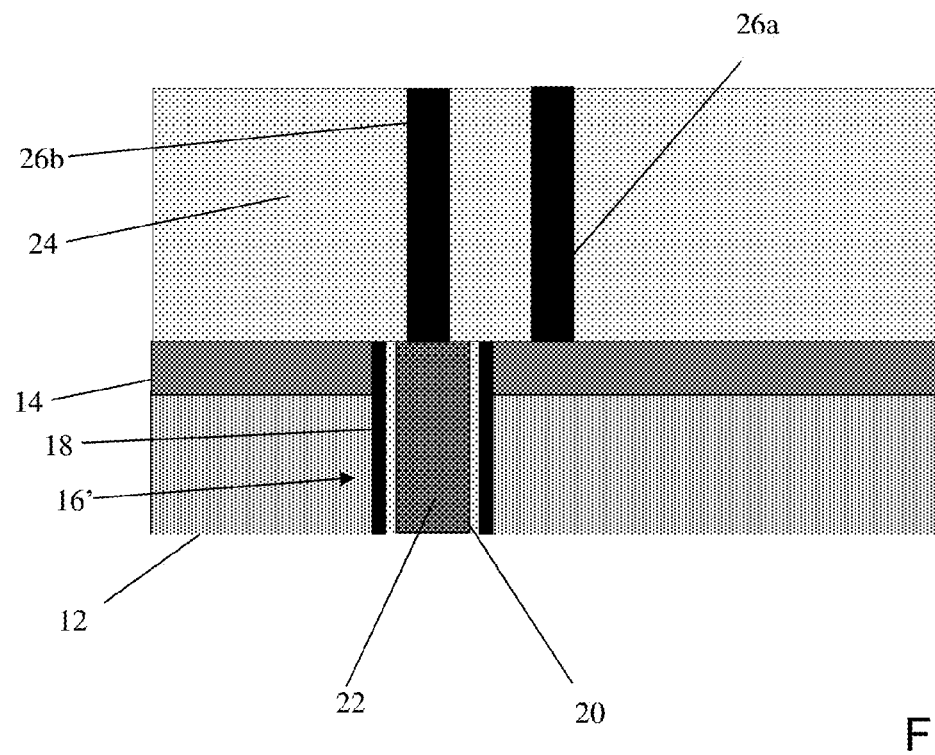
FIG. 4 shows contacts contacting the filled via structure and the N-type implant layer, in accordance with aspects of the present disclosure.

As shown in FIG. 4, the backside of the substrate 12 undergoes a thinning process, e.g., grinding process, to form a through silicon via 16'. An insulator layer 24, e.g., inter-level dielectric layer, is deposited on the front side of the substrate 12 and contacts 26a and 26b are formed in the substrate 12, contacting the N+ layer 14 and the metallization of the TSV 16', respectively. In embodiments, the N+ layer 14 is within the "excluded zone", e.g., outside of the perimeter of the TSV 16'. Accordingly, when the TSV 16' is used in a circuit, the contact 26a can be a circuit ground contact, e.g., in contact with a ground plane, directly connecting to the N+ layer 14, e.g., NB implant block, adjacent to the insulator layer 20 of the TSV 16'. Also, since the TSV N+ layer 18 is local to the TSV 16' (e.g., estimated at about 0.3 µm from the TSV 16'), the N+ layer 14 will be in good electrical contact forming a reliable TSV capacitor. In this way, the contact 26a can be used as an ohmic contact for electrostatic control of the TSV N+ layer 18 surrounding the TSV 16,' resulting in a stable capacitance value for the TSV across die to die as well as across frequencies. Also, using the contact 26b will avoid p-n junction interface and its variability in series.

Referring still to FIG. 4, the contacts 26a and 26b can be formed by conventional lithography, etching and deposition processes known to those of skill in the art. More specifically, after the insulator layer 24 is deposited over the substrate 12, a resist formed over the insulator layer 24 is exposed to energy (light) to form a pattern (opening). An etching process with a selective chemistry, e.g., reactive ion etching (RIE), will be used to form one or more trenches in the insulator layer 24 through the openings of the resist. The resist can then be removed by a conventional oxygen ashing process or other known stripants. Following the resist removal, conductive material can be deposited by any conventional deposition processes, e.g., chemical vapor deposition (CVD) processes to form the contacts 26a, 26b. Any residual material on the surface of the insulator layer 24 can be removed by conventional chemical mechanical polishing (CMP) processes.

Figure 5:
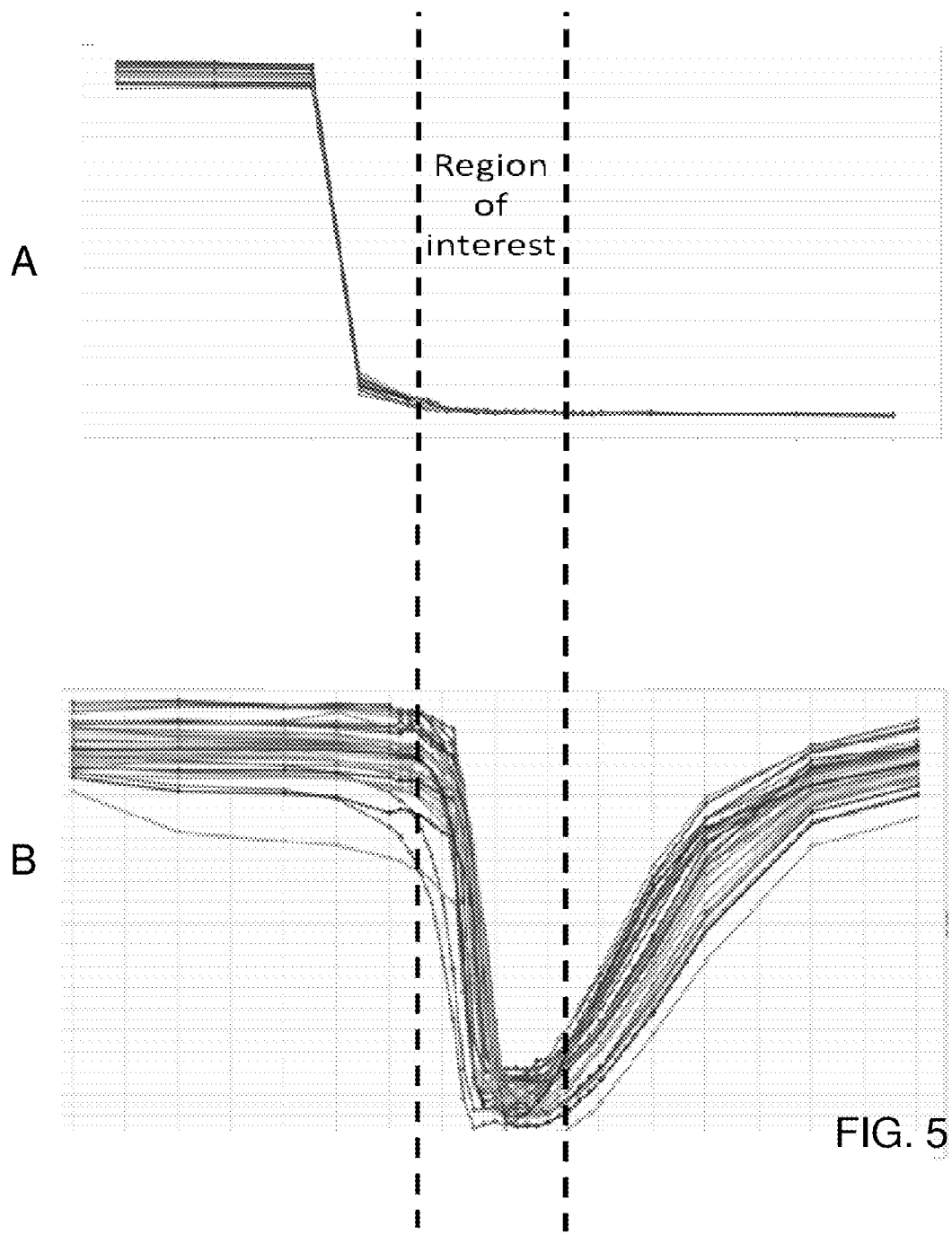
FIG. 5 shows a comparison graph of capacitance variability between the structure shown representatively in FIG. 4 and a conventional through-silicon-via structure.

FIG. 5 shows a comparison graph of capacitance variability between the structure shown representatively in FIG. 4 and a conventional through-silicon-via structure. In FIG. 5, the Y-axis is capacitance and the X-axis is voltage. Also, the top graph "A" is a structure in accordance with aspects described herein; whereas, the bottom graph "B" is a conventional structure, e.g., a structure without the contacted N+ layer. As shown in "A", in the area of interest, there is little variability in capacitance at a low bias for the structure described herein. In comparison, in a conventional structure shown in "B", there is a very large variability in capacitance as shown by the vertical extent of the several lines which represent different test dies, as well as the spacing of the lines from one another throughout the graph.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising:
   a substrate of a first species type;
   a layer of different species type on the substrate;
   a through substrate via formed through the substrate and comprising an insulator sidewall and conductive fill material;
   a second species type adjacent the through substrate via;
   a first contact in electrical contact with the layer of different species type; and
   a second contact in electrical contact with the conductive fill material of the through substrate via.

2. The structure of claim 1, wherein the substrate is Si material.

3. The structure of claim 1, wherein the substrate is bulk substrate.

4. The structure of claim 1, wherein the substrate is a silicon on insulator (SOI) and the layer of different species type is below the insulator.

5. The structure of claim 1, wherein the layer of different species type is an N+ layer surrounding the through substrate via and electrically isolated from the conductive fill material by the insulator sidewall and coupled to the second species type adjacent the through substrate via.

6. The structure of claim 1, wherein the first species type is P-type and the second species type is n-type.

7. The structure of claim 1, wherein the first contact is in direct electrical contact with the layer of different species type.

8. The structure of claim 1, wherein the first contact is an ohmic contact for electrostatic control of the layer of different species type surrounding the through substrate via.

9. A structure comprising:
   a p-type substrate;
   an N+ layer on the substrate;
   a through substrate via formed through the substrate and comprising an insulator sidewall and conductive fill material and surrounded by n-type species;
   a first contact in direct electrical contact with the N+ layer and isolated from the conductive fill material by the insulator sidewall; and
   a second contact in electrical contact with the conductive fill material of the through substrate via.

10. The structure of claim 9, wherein the p-type substrate is Si material.

11. The structure of claim 9, wherein the p-type substrate is bulk substrate.

12. The structure of claim 9, wherein the p-type substrate is a silicon on insulator (SOI) and the N+ layer is below the insulator.

13. The structure of claim 9, wherein the first contact is an ohmic contact for electrostatic control of the N+ layer surrounding the through substrate via.

* * * * *